United States Patent [19]

Chang

[11] 4,361,461
[45] Nov. 30, 1982

[54] HYDROGEN ETCHING OF SEMICONDUCTORS AND OXIDES

[75] Inventor: Robert P. H. Chang, Warren, N.J.

[73] Assignee: Bell Telephone Laboratories, Incorporated, Murray Hill, N.J.

[21] Appl. No.: 243,622

[22] Filed: Mar. 13, 1981

[51] Int. Cl.$^3$ ................ H01L 21/306; B44C 1/22; C03C 15/00; C03C 25/06

[52] U.S. Cl. ............................ 156/643; 156/646; 156/657; 156/659.1; 156/662; 204/192 E; 427/38

[58] Field of Search ............... 156/643, 646, 653, 657, 156/659.1, 662, 345; 252/79.1; 204/164, 192 EC, 192 E, 298; 427/38, 39, 43; 148/1.5

[56] References Cited

U.S. PATENT DOCUMENTS

| | | | |
|---|---|---|---|
| 3,940,506 | 2/1976 | Heinecke | 427/38 |
| 4,094,732 | 6/1978 | Reinberg | 204/192 E |
| 4,227,975 | 10/1980 | Hartman et al. | 204/15 |
| 4,266,986 | 5/1981 | Benton et al. | 148/1.5 |
| 4,284,689 | 8/1981 | Craighead et al. | 204/192 E |
| 4,285,762 | 8/1981 | Moustakas | 156/662 X |
| 4,285,763 | 8/1981 | Coldren | 156/646 X |

OTHER PUBLICATIONS

Chemical Etching of Silicon, Germanium, Gallium Arsenide, and Gallium Phosphide by W. Kern, RCA Review, vol. 39, pp. 278–294, 1978.
Selective Etching of Silicon Dioxide Using Reactive Ion Etching with $CF_4$–$H_2$ by L. M. Ephrath, Journal of the Electrochemical Society, pp. 1419–1421, Aug. 1979.
Reactivity of Solid Silicon with Hydrogen Under Conditions of a Low Pressure Plasma by A. P. Webb et al., Chemical Physics Letters, vol. 62, pp. 173–177, 1979.
In Situ Thermogravimetry–A Tool for Quantitative Study of Plasma–Surface Interaction, by S. Veprek et al., Conference Proceedings, 4th International Symposium on Plasma Chemistry, pp. 79–89, 1979, Published by University of Zurich, Switzerland.
Comprehensive Inorganic Chemistry, Pergamon Press, 1973, at Table 19, p. 74, Physical Properties of Covalent Hydrides.
Plasma–Assisted Etching Techniques for Pattern Delineation, by C. M. Melliar-Smith et al., Thin Film Processes, J. L. Vossen and W. Kern, Editors, Academic Press, NY, 1978, pp. 526–529.
A Model for the Dissociation of Hydrogen in an Electric Discharge by A. T. Bell, Industrial and Engineering Chemistry Fundamentals, vol. 11, pp. 209–215, 1972.
Dissociation and Ionization of Hydrogen in High Frequency Discharges, by C. C. Goodyear et al., Proceedings of the Physical Society, vol. 79, pp. 732–740, 1962.
Some Chemical Aspects of the Fluorocarbon Plasma Etching of Silicon and its Compounds, by J. W. Coburn et al., IBM Journal of Research and Development, vol. 23, pp. 33–41, 1979.

*Primary Examiner*—William A. Powell
*Attorney, Agent, or Firm*—James H. Fox; Peter V. D. Wilde

[57] ABSTRACT

Atomic hydrogen, typically produced in a plasma, etches a wide range of materials, including III–V materials and their oxides. GaAs oxide is etched at a faster rate than GaAs, for example, providing significant possibilities for processing integrated circuits and other devices. Silicon is etched preferentially as compared to silicon dioxide or silicon nitride. Native oxides are also conveniently removed by this method prior to other processing steps.

14 Claims, 3 Drawing Figures

HYDROGEN ETCHING OF SEMICONDUCTORS AND OXIDES

BACKGROUND OF THE INVENTION

1. Field of the Invention

This invention relates to the production of solid state devices by the etching of semiconductor materials and oxides.

2. Description of the Prior Art

In the production of solid state devices, including semiconductor devices, one nearly universal step is the etching of a semiconductor material or an oxide. One use of an etch is to remove native oxide material that naturally forms on a semiconductor upon exposure to air. In another use, semiconductor material is etched to improve its smoothness and to remove defects in the surface. In still another use, a patterned layer is etched in a semiconductor or a protective material thereon. For example, a semiconductor is etched wherein the unetched region is protected by a patterned oxide layer. Conversely, an oxide layer may be selectively etched wherein the unetched oxide is protected by a patterned layer of resist material.

In the past, most etching operations have been accomplished by the use of a liquid etchant. Typical liquid etchants include halogens in solution, including for example, HF, HCL, $Br_2$, $I_2$, etc. However, in current semiconductor device production, the trend is towards dry plasma etching methods, typically wherein an ionized species is responsible for, or contributes to, the etching operation. Plasma etching atmospheres typically also comprise halogens or halogen-containing compounds, such as $CF_4$, $SF_6$, etc. Dry etching atmospheres have various advantages oven liquid etchants, including for example, improved anisotropy of the etch, and the ability to be more easily automated along a continuous production line. An overview of current etching compositions, both liquid and plasma, is given in "Chemical Etching of Silicon, Germanium, Gallium Arsenide, and Gallium Phosphide", by W. Kern, in the RCA Review, Vol. 39, at page 278 (1978).

One of the current problems in semiconductor manufacturing processes is the selective dry etching of oxides of III–V compound semiconductor material, such as GaAs oxide, InP oxide, etc. In particular, typical prior art etchants preferentially etch the semiconductor material as compared to its oxide. Therefore, if the patterned oxide on a III–V compound semiconductor is etched, severe undercutting typically occurs under portions of the oxide layer. One method of forming patterns of III–V oxides on III–V semiconductor substrates is by first forming a protective layer, typically $SiO_2$ or $Si_3N_4$, that can be selectively etched compared to the substrate. The III–V material is then oxidized in regions from which the protective layer has been removed; see U.S. Pat. No. 4,227,975, assigned to the same assignee as the present invention. However, it is desirable in many cases to selectively etch the patterned III–V oxide directly, avoiding extra processing steps. Furthermore, it is desirable to have a dry etching technique for removing the native oxides on III–V compound semiconductor material that form upon exposure to the atmosphere prior to other processing steps.

In processing silicon semiconductor devices, it is frequently necessary to etch the silicon preferentially to a silicon dioxide or silicon nitride patterned layer overlying the silicon. This need arises, for example, when forming polycrystalline silicon sense lines in memory integrated circuits, logic circuits, etc. While certain etchants, including plasma etchants, are known to be capable of etching silicon preferentially to silicon dioxide and silicon nitride, it is desirable to find additional etchants for this purpose.

The use of $H_2$ gas in conjunction with halocarbon compounds in plasma etching atmospheres is known. The $H_2$ gas typically forms a minor proportion of the atmosphere, typically less than 10 percent; see, for example, "Selective Etching of Silicon Dioxide Using Reactive Ion Etching With $CF_4$—$H_2$", by L. M. Ephrath, in the *Journal of the Electrochemical Society*, page 1419 (1979). As practiced in the art, this technique calls for adding the $H_2$ gas to reduce the etch rate of the silicon, while leaving the etch rate of the silicon dioxide or silicon nitride substantially unchanged in the presence of a halocarbon plasma atmosphere; see, for example, U.S. Pat. No. 3,940,506. This behavior is conventionally explained by stating that the hydrogen gas acts as a recombination center for fluorine ions, which preferentially attack silicon.

The use of a pure hydrogen plasma to erode silicon is a known phenomenon; see, for example, "Reactivity of Solid Silicon With Hydrogen Under Conditions of a Low Pressure Plasma", by A. P. Webb et al, in *Chemical Physics Letters*, Vol. 62, pages 173–177 (1979). However, this technique has not been widely adopted for semiconductor device use, perhaps because no selectivity of etching silicon with regards to silicon dioxide or silicon nitride, the common protective mask materials, has been shown. Atomic hydrogen has also been used to passivate defects produced in laser-annealed semiconductors under conditions in which substantially no etching is produced; see U.S. Patent application Ser. No. 98,398, filed Nov. 29, 1979, U.S. Pat. No. 4,266,986, assigned to the same assignee as the present invention.

For the above-noted reasons, it would be desirable to have a dry etching atmosphere that would selectively etch silicon in the presence of silicon dioxide or silicon nitride, and to etch the oxides of III–V compounds and/or the III–V materials themselves.

SUMMARY OF THE INVENTION

I have invented a method of etching semiconductor material and oxides thereof by reacting atomic hydrogen with the material to produce a volatile hydride at a temperature below the melting temperature of the material etched. The atomic hydrogen may be produced by dissociation of $H_2$ gas in a plasma. Various of the III–V semiconductor materials and oxides thereof are etched by this technique. Silicon, including single crystal silicon and polysilicon, is preferentially etched compared to silicon dioxide or silicon nitride by this technique. Although conveniently the atomic hydrogen is produced in a plasma, it can also be produced by other techniques for dissociation of $H_2$ gas, including applying photon, electron, or ion energy, or by dissociation of hydrogen-containing compounds or other techniques. The dissociation process may be accomplished in the presence of, or external to, the material being etched. Atomic hydrogen can also be formed directly on the surface being etched.

DETAILED DESCRIPTION

The following detailed description relates to a method of etching semiconductor material and certain oxides thereof by the use of atomic hydrogen.

EXPERIMENTAL CONDITIONS

Figure 1:
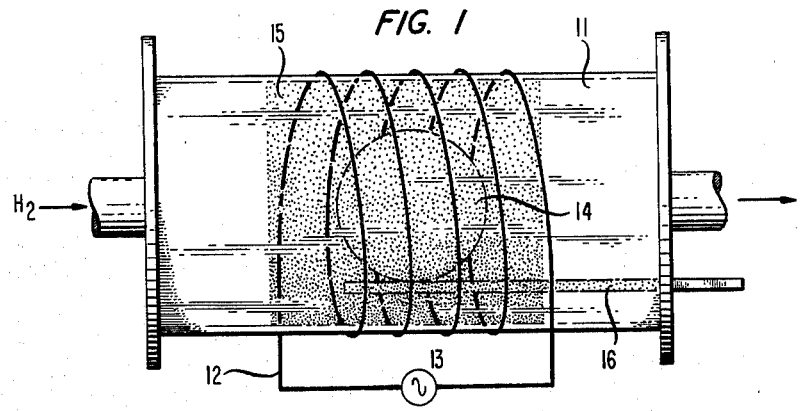
FIG. 1 shows a typical apparatus for etching.

The etching described herein was carried out in a quartz discharge tube (see FIG. 1). The tube 11 had an inside diameter of about 1.5 inches. The RF power (at 30 MHz) from source 13 was coupled into the plasma by a coil 12 wound around the discharge tube. A typical RF power density of approximately 1.2 watts/cm$^3$ was obtained at an RF power level of 400 watts applied to the coil. For optimal etching at this power, $H_2$ gas pressure in the range of 0.1 to 0.3 torr is used. For other power levels, a different pressure range will likely be optimum for maximum atomic H production from $H_2$ gas, as discussed in "A Model for the Dissociation of Hydrogen in an Electric Discharge", by A. T. Bell, *Ind. Eng. Chem. Fundam.*, Vol. 11, pages 209–215 (1972). Pressures as low as $10^{-3}$ torr and as high as 10 torr have also been used to achieve etching with an even wider range likely to work at appropriate power levels. At a pressure of 0.2 torr, the flow rate of $H_2$ gas was 13 cm$^3$/minute through the tube. The discharge tube was cooled by a fan. The substrate to be etched (14) was placed on a quartz support 16. All the experimental results reported here were taken at a substrate temperature initially at ambient (20 degrees Celsius) at the beginning of the etch. During etching, the substrate temperature increased as a result of heating by the plasma, reaching an estimated temperature of about 60 degrees Celsius after a 20 minute etch at a power of 400 watts in a 0.2 torr atmosphere. Shorter etching times produced less substrate heating.

The oxide film etch rates were determined optically by monitoring the interference fringes. The etch rates of the semiconductors were determined by measuring the thickness of the substrate material consumed in the unmasked region with a scanning electron microscope (SEM). The SEM was also used to study the surface morphology of the etch substrate. For very thin surface oxide removal, a scanning ellipsometer was used to study the surface properties. Surface composition and Auger profiles of etched films were studied by a PHI 590A system equipped with a cylindrical mirror analyzer having an energy resolution of 0.3 percent and an integral electron gun with a maximum energy of 10 KeV. Auger data were acquired in the "derivative" mode, and the operating conditions were 3–6 V peak-to-peak ac modulation, incident electron currents of 0.1–2 $\mu$A, and incident electron energy of 5 KeV. Ion milling was accomplished using a differentially pumped sputter gun (PHI) with a small-diameter beam (several hundred microns) that could be rastered to attain uniform milling over an area of about 1 mm$^2$. Auger data were obtained with a spatial resolution of 0.2 $\mu$m so that small etch artifacts could be studied in some detail.

A UV spectrum of a $H_2$ plasma discharge operating at 120 watts of RF power and a pressure of 0.25 torr shows a broadband emission from 2000–4000 Angstroms. This is due to the emission from hydrogen-molecule dissociation. As the pressure is lowered, the UV emission decreases, implying less atomic hydrogen is produced. A plot of the etch rate versus the gas pressure for a fixed RF power (see FIG. 3) also shows a decrease in etch rate with pressure. The atomic hydrogen production in this apparatus appears to qualitatively follow the model proposed in the Bell article above.

EXAMPLE 1

GaAs samples of both n and p-type ($10^{18}$ cm$^{-3}$ doped) bulk single crystals, with a thin layer of native oxide (~20 Angstroms), were used for this Example. These samples were first characterized by ellipsometry, SEM, and Auger spectrometry. Then they were etched in the hydrogen plasma at RF power of 400 watts and a pressure of 0.2 torr for a predetermined increment of time. The etched surfaces were immediately analyzed for composition, morphology, and the film thickness. This process was iterated several times. The SEM picture of the GaAs sample prior to etching showed that it was covered with pits, causing it to have a slightly rough surface. The ellipsometer data also showed this effect, plus the existence of a thin native oxide of about 20 Angstroms. Upon etching for 10 seconds, the native oxide was substantially removed, and no appreciable surface roughness was seen in the SEM picture. After the removal of the native oxide, the GaAs substrate began to be etched. Upon etching 3 minutes, 40 seconds, the surface roughness showed up as a porous film. With still longer etching time (13 minutes, 40 seconds), the SEM picture showed shallow craters starting to form. The surface composition was studied by scanning Auger spectroscopy. No surface segregation of the elements was observed from point-to-point on all of the sample surfaces. The Ga/As ratio of the etched samples was very close to that of air-cleaved samples, with a difference of only about 3–8 percent.

EXAMPLE 2

Epitaxially grown GaAs, having a smoother surface as compared to the bulk GaAs of Example 1, is used in this Example. The plasma conditions are the same as in Example 1. The removal rate of the native oxide, and the epitaxial GaAs, was substantially the same as for Example 1. However, SEM pictures of the unetched and etch samples showed that no observable changes in surface morphology occurred during etching. Therefore, the surface roughness on the bulk crystals of Example 1 after etching is likely due to surface pits and defects in the crystal.

EXAMPLE 3

The surface etching of bulk single crystal GaSb is given in this Example. The etching conditions and times are the same as in Example 1 above. The surface morphology change studied by SEM is very similar to that of GaAs. The removal of native oxide (~20 Angstroms) was accomplished in less than 10 seconds, as before. Scanning Auger shows that there is no evidence of surface segregation, and the Ga/Sb ratio of the etched sample is within 10 percent of that of the air-cleaved sample.

EXAMPLE 4

Figure 2:
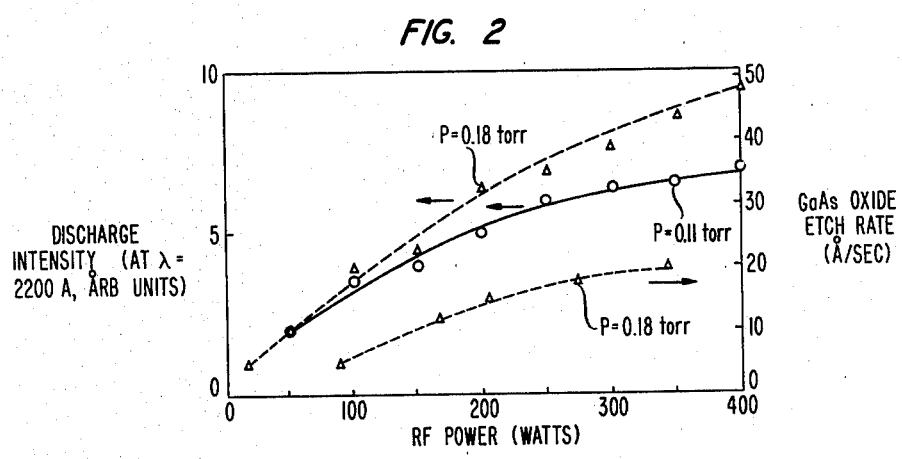
FIG. 2 shows etch rates of GaAs oxide as a function of RF power applied to the plasma.
Figure 3:
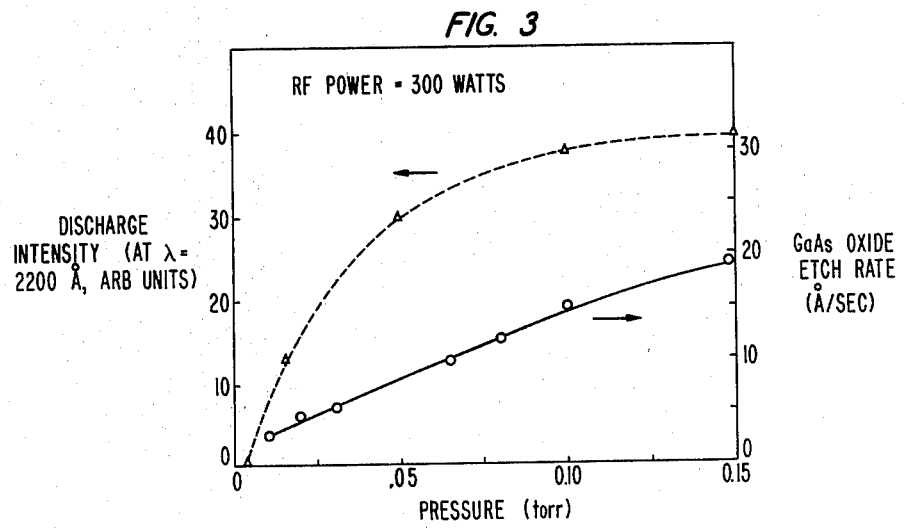
FIG. 3 shows etch rates of GaAs oxide as a function of hydrogen pressure.

The etch rates for the GaAs oxide measured as functions of RF power and hydrogen pressure are shown in FIGS. 2 and 3. These oxides were grown in an oxygen-plasma ambient, as described in U.S. Pat. No. 4,062,747, assigned to the same assignee as the present invention.

The "GaAs oxide" is believed to be substantially a mixture of $Ga_2O_3$ and $As_2O_3$, with other gallium or arsenic oxide species possibly also present. FIGS. 2 and 3 also show the UV intensity as a function of RF power and gas pressure. As expected, the intensity (and thus the etch rate) increases with RF power because both electron density and possibly electron energy increase with the RF field density. Useful etch rates are observed for an RF power level as low as 100 watts, corresponding to an RF power density in the plasma discharge region of the tube of approximately 0.3 watt/$cm^3$. In the gas pressure range shown in FIG. 3, the hydrogen atom production increased with pressure, and thus the UV intensity and the oxide etch rate.

To measure the etch rates of the GaAs, $SiO_2$ was used as a protective patterned mask material, and the amount of material consumed in the unmasked region was measured with SEM. From these and earlier data, it was determined that the etch ratio of GaAs oxide to GaAs is at least 1 to 1, and typically nearly 2 to 1. In addition, a degree of anisotropy was observed, wherein etching to a depth of 7 micrometers in GaAs produced undercutting of the $SiO_2$ mask of only about 3 micrometers.

The above procedure was also used to etch $Ga_2O_3$ deposited by plasma-assisted chemical vapor deposition on a GaAs substrate. A comparable etch rate of $Ga_2O_3$, and etch selectively compared to GaAs, was obtained, as with the native grown GaAs oxide.

EXAMPLE 5

GaSb oxide comprising $Ga_2O_3$ and $Sb_2O_3$ was formed on a GaSb substrate according to the plasma oxidation technique of the above-noted patent. The etch rates for the GaSb and the GaSb oxide were comparable for those of the GaAs and GaAs oxide, as shown in Example 4. Thus, the selectivity of the etch was comparable, with the etch rate ratio of GaSb oxide to GaSb being at least 1 to 1.

EXAMPLE 6

A series of ellipsometric measurements and SEM picture of etched InP surfaces was made. The RF power for these cases was 50 watts, and the pressure was 0.2 torr. Comparing to the case of GaAs, InP can be etched much more easily; (the etch rate is about a factor of 10 higher). Again, after a short period of etching time (30 seconds), the native oxide has been substantially removed. Up to this point, the Auger data show that the P/In ratio on the surface is very similar to that of air-cleaved surface. But after 70 seconds of etching, hemispherical shells started to form on the InP surface. Auger measurements for the 70 second etched sample continued to show no surface segregation, although the P/In ratio is only $\frac{1}{4}$ of that of the air-cleaved InP sample. Thus, while the In is etched to some degree, the P is etched at a higher rate, leading to an In-rich surface layer.

EXAMPLE 7

To measure the etch rates for the InP oxide, a 2000 Angstrom, chemically anodized native InP oxide, comprising $In_2O_3$ and $P_2O_5$, was used. The etch rate was about 100 Angstroms/second at 400 watts of RF power and a hydrogen gas pressure of 0.2 torr. Under the same operating conditions, InP surfaces masked with $SiO_2$ were etched. Large micron-sized hemispheres, which were found to be pure indium, formed from nucleation and preferential etching of phosphorus over indium. Although both phosphorus and indium form hydrides, phosphorus hydride has a much lower heat of formation and melting point than indium hydride. Thus, a hydrogen plasma is useful for etching InP oxide. It is also useful for etching InP to at least 200 Angstroms, but beyond about 500 Angstroms, surface segregation occurs.

EXAMPLE 8

Using the above experimental setup, the etching of Si, $SiO_2$, and $Si_3N_4$ was conducted. Thermally grown, thick (3500 Angstrom) $SiO_2$ films and masked (with $SiO_2$ or $Si_3N_4$) Si substrates were used. For an RF power of 400 watts and a pressure of 0.2 torr, it was determined by scanning ellipsometry that $SiO_2$ could be etched at a rate of about 10-15 Angstroms/minute. Similar etch rates were also obtained for silicon nitride. By measuring the amount Si consumed in the unmasked region for a given increment of time, it was found that Si etched at a rate of about 250-500 Angstroms/minute. This gives an etch ratio of greater than 20 for Si over $SiO_2$ or $Si_3N_4$. Deposited polysilicon (3500 Angstroms) on $SiO_2$ was also etched. The etch rate of polysilicon was as high as 700 Angstroms/minute for the above operating condition, for an etch ratio of greater than 40 for polysilicon over $SiO_2$ or $Si_3N_4$. It was found that the etch rate of Si was not constant over the period of exposure to the plasma. Substantially no etching occurred during about the first minute of exposure, with the above etch rate values being averaged over the entire exposure time. Thus, once etching began, it occurred at a still higher rate that the above values indicate. The surface morphology change with etching time was studied by scanning ellipsometry and SEM, as in the case for GaAs and InP. However, in the case of Si, the surface morphology remained nearly the same initially as the unetched sample. For a 20 minute etch, it was found that the Si surface become rough only after 15 minutes of etching.

Since these experiments were carried out in a discharge tube also made (mostly) of $SiO_2$, the etch rates of Si and $SiO_2$ can be higher in a different plasma system. In the present setup, the redeposition of $SiO_2$ on surfaces inside the discharge tube was observed after long periods ($\sim 1$ hour) of operation. It has been found that initially flushing the plasma discharge tube with $CH_4$ for 5 minutes, while operating at 400 watts RF at room temperature, results in an increase in the subsequent etch rate of the materials noted in the above Examples. This results from reducing the recombination rate of atomic hydrogen on the walls of the tube, which is believed to be due to a layer of polymeric carbon on the walls of the tube. Other coating materials can also be used to this effect. In any case, it is desirable to maintain a density of at least $10^{14}$ hydrogen atoms/$cm^3$ at the surface of the etched material. In the above apparatus, at a power of 400 watts and a $H_2$ pressure of 0.2 torr, it is estimated that a density of atomic hydrogen of about $6 \times 10^{14}$ H atoms/$cm^3$ is obtained.

Although the above Examples utilize atomic hydrogen produced in a plasma, other sources of atomic hydrogen can be utilized. Photon energy, electron energy, etc., can be utilized to dissociate molecular hydrogen to produce the atomic hydrogen, or the atomic hydrogen may be produced by the dissociation of hydrogen-containing compounds. Also, the atomic hydrogen can be formed on the surface to be etched, as by proton bombardment of the surface at a suitable energy level to capture an electron, under conditions suitable to obtain a residence time of the H sufficient for etching. In addition, $H_2+$, $H_3+$ ions, etc., can be used to obtain atomic hydrogen; see "Dissociation and Ionization of Hydrogen in High Frequency Discharges", by C. C. Goodyear et al, *Proceedings of the Physical Society*, Vol. 79, pages 732-740 (1962), at page 733. The ions may be accelerated, as by a bias on the substrate or by other means, typically to impart an additional degree of anisotropy to the etch, or to increase the etch rate.

It is also known in the plasma art that the use of heavier elements can be used to achieve a sputtering effect, wherein a portion of the substrate material is removed by momentum exchange. For example, reactive ion etching (RIE) is a process wherein an electrical bias is applied to the substrate to attract ions to the substrate. These may chemically interact with the surface or may sputter the surface by momentum exchange. Other molecules or ionized species, when used with the atomic hydrogen as called for in the present invention, should not serve to act as significant recombination centers for the atomic hydrogen, which would reduce the effectiveness of the hydrogen etch. For example, argon is used as a sputtering agent in many RIE systems. If sufficiently ionized to a sufficient energy level, argon can be used in practicing the present invention, since sufficiently energetic argon will not serve to cause excessive recombination of the atomic hydrogen. Other systems are possible for practicing the present invention, including for example, reactive ion beam etching systems (RIBE), wherein the ionized species are produced externally to the etching chamber, with the introduction of the ionized species being controlled by a grid element electrically biased to achieve a balance of chemical etching effects and physical sputtering effects.

To distinguish the present invention from plasma systems wherein hydrogen is utilized for other purposes, including for example, to act as recombinant centers for fluorine as noted above, the present invention is herein limited to require that a substantial proportion of the material etched is removed by the formation of a volatile hydride at the etching temperature. When etching semiconductor material having a patterned oxide layer thereon, typically at least 100 Angstroms of the semiconductor material is removed by this technique. When etching an oxide to produce a patterned layer on a semiconductor (or other material), typically at least 100 Angstroms of the oxide is removed. For removing native oxide layers formed by exposure to the atmosphere, typically about 20 Angstroms of oxide is etched. The above Examples show etching by hydride formation for materials comprising Ga, As, In, P, Sb, and their oxides, and also Si, with still others being possible. However, such hydride formation can be accompanied by, or assisted by, physical sputtering effects as noted above. It is to be expected that an optimum balance of physical sputtering effects and chemical effects can achieve increased selectivity of etching oxides of III-V materials as compared to the III-V materials themselves. Furthermore, the lifetime of the atomic hydrogen at the surface being etched can be adjusted, as by other gases in the etching atmosphere or coatings on the substrate surface, to achieve an increased degree of selectivity of the etch as between different substrate materials. All such variations and deviations which basically rely on the teachings through which the present invention has advanced the art are considered to be within the spirit and scope of the present invention.

What is claimed is:

1. A method of making a device including the step of etching a III-V material or at least one oxide comprising at least one III-V element from a device precursor, characterized in that said etching is accomplished to a substantial degree by reacting atomic hydrogen with said material or oxide to form a volatile hydride at a temperature below the melting temperature of said material or oxide.

2. The method of claim 1 further characterized in that said etching substantially removes a native oxide layer of a III-V material from a substrate of said III-V material.

3. The method of claim 1 further characterized in that said etching is accomplished on a patterned III-V material device precursor, wherein an oxide of said III-V material is removed at a rate at least as high as the rate of removal of said III-V material.

4. The method of claim 1 further characterized in that said III-V material or said oxide comprises at least one element selected from the group consisting of gallium, arsenic, antimony, indium, and phosphorus.

5. The method of claim 1 further characterized in that said atomic hydrogen is produced by a hydrogen plasma.

6. The method of claim 1 further characterized in that said atomic hydrogen is produced by dissociation of a hydrogen-containing compound.

7. The method of claim 1 further characterized in that the density of atomic hydrogen adjacent to the material being etched is at least $10^{14}$ hydrogen atoms per cubic centimeter.

8. The method of claim 1 further characterized in that said etching removes at least 100 Angstroms of said III-V material or said oxide.

9. A method of making a device including the step of etching silicon patterned with a layer comprising silicon nitride characterized in that said etching is accomplished to a substantial degree by reacting atomic hydrogen with said silicon to form a volatile hydride at a temperature below the melting temperature of said silicon so that said silicon is etched at a faster rate than said layer comprising silicon nitride.

10. The method of claim 9 further characterized in that said silicon is in the form of polycrystalline silicon.

11. The method of claim 9 further characterized in that said atomic hydrogen is produced by a hydrogen plasma.

12. The method of claim 9 further characterized in that said atomic hydrogen is produced by dissociation of a hydrogen-containing compound.

13. The method of claim 9 further characterized in that the density of atomic hydrogen adjacent to said silicon is at least $10^{14}$ hydrogen atoms per cubic centimeter.

14. The method of claim 9 further characterized in that the exposure of said silicon to said atomic hydrogen is for a time sufficient to etch a layer of said silicon at least 100 Angstroms thick.

* * * * *